United States Patent
Shi

(10) Patent No.: US 8,222,145 B2
(45) Date of Patent: Jul. 17, 2012

(54) METHOD AND COMPOSITION FOR CHEMICAL MECHANICAL PLANARIZATION OF A METAL-CONTAINING SUBSTRATE

(75) Inventor: Xiaobo Shi, Chandler, AZ (US)

(73) Assignee: DuPont Air Products Nanomaterials, LLC, Allentown, PA (US)

( * ) Notice: Subject to any disclaimer, the term of this patent is extended or adjusted under 35 U.S.C. 154(b) by 121 days.

(21) Appl. No.: 12/881,574

(22) Filed: Sep. 14, 2010

(65) Prior Publication Data

US 2011/0070735 A1    Mar. 24, 2011

Related U.S. Application Data

(60) Provisional application No. 61/245,312, filed on Sep. 24, 2009.

(51) Int. Cl.
*H01L 21/302* (2006.01)
*H01L 21/461* (2006.01)

(52) U.S. Cl. ........................................ 438/692; 438/693

(58) Field of Classification Search .................. 438/692
See application file for complete search history.

(56) References Cited

U.S. PATENT DOCUMENTS

| 4,789,648 | A | 12/1988 | Chow et al. | |
|---|---|---|---|---|
| 6,180,712 | B1 | 1/2001 | Ishikawa et al. | |
| 7,083,831 | B1* | 8/2006 | Koch et al. | 427/515 |
| 2007/0281495 | A1* | 12/2007 | Mallick et al. | 438/778 |
| 2011/0042790 | A1* | 2/2011 | Lin | 257/635 |

OTHER PUBLICATIONS

Gregory B. Shinn, et al, Chemical-Mechanical Polish, Handbook of Semiconductor Manufacturing Technology, 2000, 415-460, New York City.

* cited by examiner

*Primary Examiner* — Binh X Tran
*Assistant Examiner* — Thomas Pham
(74) *Attorney, Agent, or Firm* — Rosaleen P. Morris-Oskanian

(57) ABSTRACT

A composition and associated method for chemical mechanical planarization of a metal-containing substrate afford low dishing levels in the polished substrate while simultaneously affording high metal removal rates. Suitable metal-containing substrates include tungsten- and copper-containing substrates. Components in the composition include a silatrane compound, an abrasive, and, optionally, a strong oxidizing agent, such as a per-compound.

9 Claims, No Drawings

METHOD AND COMPOSITION FOR CHEMICAL MECHANICAL PLANARIZATION OF A METAL-CONTAINING SUBSTRATE

CROSS REFERENCE TO RELATED APPLICATION

The present application claims the benefit of U.S. Provisional Patent Application Ser. No. 61/245,312 filed Sep. 24, 2009.

BACKGROUND OF THE INVENTION

This invention relates generally to the chemical-mechanical planarization (CMP) of metal-containing substrates (e.g., tungsten) on semiconductor wafers and slurry compositions therefor. This invention is especially useful for tungsten CMP where low dishing/plug recess on planarized substrates is desired.

Chemical mechanical planarization (chemical mechanical polishing, CMP) for planarization of semiconductor substrates is now widely known to those skilled in the art and has been described in numerous patents and open literature publications. An introductory reference on CMP is as follows: "Chemical-Mechanical Polish" by G. B. Shinn et al., Chapter 15, pages 415-460, in Handbook of Semiconductor Manufacturing Technology, editors: Y. Nishi and R. Doering, Marcel Dekker, New York City (2000).

In a typical CMP process, a substrate (e.g., a wafer) is placed in contact with a rotating polishing pad attached to a platen. A CMP slurry, typically an abrasive and chemically reactive mixture, is supplied to the pad during CMP processing of the substrate. During the CMP process, the pad (fixed to the platen) and substrate are rotated while a wafer carrier system or polishing head applies pressure (downward force) against the substrate. The slurry accomplishes the planarization (polishing) process by chemically and mechanically interacting with the substrate film being planarized due to the effect of the rotational movement of the pad parallel to the substrate. Polishing is continued in this manner until the desired film on the substrate is removed with the usual objective being to effectively planarize the substrate. Typically metal CMP slurries contain an abrasive material, such as silica or alumina, suspended in an oxidizing, aqueous medium.

There are a large number of materials used in the manufacture of integrated circuits such as a semiconductor wafer. The materials generally fall into three categories—dielectric material, adhesion and/or barrier layers, and conductive layers. The use of the various substrates, e.g., dielectric material such as tetraethylorthosilicate (TEOS), plasma enhanced tetraethylorthosilicate (PETEOS), and low-k dielectric materials; barrier/adhesion layers such as tantalum, titanium, tantalum nitride, and titanium nitride; and conductive layers such as copper, aluminum, tungsten, and noble metals are known in the industry.

Integrated circuits are interconnected through the use of well-known multilevel interconnections. Interconnection structures normally have a first layer of metallization, an interconnection layer, a second level of metallization, and typically third and subsequent levels of metallization. Interlevel dielectric materials such as silicon dioxide and sometimes low-k materials are used to electrically isolate the different levels of metallization in a silicon substrate or well. The electrical connections between different interconnection levels are made through the use of metallized vias and in particular tungsten vias. U.S. Pat. No. 4,789,648 describes a method for preparing multiple metallized layers and metallized vias in insulator films. In a similar manner, metal contacts are used to form electrical connections between interconnection levels and devices formed in a well. The metal vias and contacts are generally filled with tungsten and generally employ an adhesion layer such as titanium nitride (TiN) and/or titanium to adhere a metal layer such as a tungsten metal layer to the dielectric material.

In one semiconductor manufacturing process, metallized vias or contacts are formed by a blanket tungsten deposition followed by a CMP step. In a typical process, via holes are etched through the interlevel dielectric (ILD) to interconnection lines or to a semiconductor substrate. Next, a thin adhesion layer such as titanium nitride and/or titanium is generally formed over the ILD and is directed into the etched via hole. Then, a tungsten film is blanket deposited over the adhesion layer and into the via. The deposition is continued until the via hole is filled with tungsten. Finally, the excess tungsten is removed by chemical mechanical polishing (CMP) to form metal vias.

The ratio of the removal rate of a metal (e.g., tungsten) to the removal rate of a dielectric base is called the "selectivity" for removal of the metal in relation to removal of the dielectric during CMP processing of substrates comprised of metal and dielectric material. When CMP slurries with high selectivity for removal of metal in relation to dielectric are used, the metal layers are easily over-polished creating a depression or "dishing" effect in the metalized areas. This feature distortion is unacceptable due to lithographic and other constraints in semiconductor manufacturing.

Another feature distortion that is unsuitable for semiconductor manufacturing is called "erosion." Erosion is the topography difference between a field of dielectric and a dense array of metal vias or trenches. In CMP, the materials in the dense array may be removed or eroded at a faster rate than the surrounding field of dielectric. This causes a topography difference between the field of dielectric and the dense metal (e.g., copper or tungsten) array.

CMP processing is often employed to remove and planarize excess copper metal at different stages of semiconductor manufacturing. For example, one way to fabricate a multilevel copper interconnect or planar copper circuit traces on a silicon dioxide substrate is referred to as the damascene process. In a semiconductor manufacturing process typically used to form a multilevel copper interconnect, metallized copper lines or copper vias are formed by electrochemical metal deposition followed by copper CMP processing.

In a typical process, the interlevel dielectric (ILD) surface is patterned by a conventional dry etch process to form vias and trenches for vertical and horizontal interconnects and make connection to the sublayer interconnect structures. The patterned ILD surface is coated with an adhesion-promoting layer such as titanium or tantalum and/or a diffusion barrier layer such as titanium nitride or tantalum nitride over the ILD surface and into the etched trenches and vias. The adhesion-promoting layer and/or the diffusion barrier layer is then overcoated with copper, for example, by a seed copper layer and followed by an electrochemically deposited copper layer. Electro-deposition is continued until the structures are filled with the deposited metal. Finally, CMP processing is used to remove the copper overlayer, adhesion-promoting layer, and/or diffusion barrier layer, until a planarized surface with exposed elevated portions of the dielectric (silicon dioxide and/or low-k) surface is obtained. The vias and trenches remain filled with electrically conductive copper forming the circuit interconnects.

When one-step copper CMP processing is desired, it is usually important that the removal rate of the metal and barrier layer material be significantly higher than the removal rate for dielectric material in order to avoid or minimize dishing of metal features or erosion of the dielectric. Alternatively, a multi-step copper CMP process may be employed involving the initial removal and planarization of the copper overburden, referred to as a step 1 copper CMP process, followed by a barrier layer CMP process. The barrier layer CMP process is frequently referred to as a barrier or step 2 copper CMP process.

Previously, it was believed that the removal rate of the copper and the adhesion-promoting layer and/or the diffusion barrier layer must both greatly exceed the removal rate of dielectric so that polishing effectively stops when elevated portions of the dielectric are exposed. The ratio of the removal rate of copper to the removal rate of dielectric base is called the "selectivity" for removal of copper in relation to dielectric during CMP processing of substrates comprised of copper, tantalum and dielectric material. The ratio of the removal rate of tantalum to the removal rate of dielectric base is called the "selectivity" for removal of tantalum in relation to dielectric during CMP processing. When CMP slurries with high selectivity for removal of copper and tantalum in relation to dielectric are used, the copper layers are easily over-polished creating a depression or "dishing" effect in the copper vias and trenches. This feature distortion is unacceptable due to lithographic and other constraints in semiconductor manufacturing.

As industry standards trend toward smaller device features, there is an ever-developing need for CMP slurries that deliver superior planarization of the nanostructures of IC chips. Specifically, for 45 nm technology nodes and smaller feature sizes, slurry products must deliver low removal rate selectivity between metal and dielectric, thereby lowering erosion while maintaining sufficient removal rate and low defect levels. Furthermore, in the competitive market of CMP consumables, low cost of ownership (CoO), specifically through concentration of CMP slurry, is quickly becoming an industry standard.

A typically used CMP slurry has two actions, a chemical component and a mechanical component. An important consideration in slurry selection is "passive etch rate." The passive etch rate is the rate at which a metal (e.g., copper) is dissolved by the chemical component alone and should be significantly lower than the removal rate when both the chemical component and the mechanical component are involved. A large passive etch rate leads to dishing of the metallic trenches and vias, and thus, preferably, the passive etch rate is less than 10 nanometers per minute.

These are two general types of layers that can be polished. The first layer is interlayer dielectrics (ILD), such as silicon oxide and silicon nitride. The second layer is metal layers such as tungsten, copper, aluminum, etc., which are used to connect the active devices.

In the case of CMP of metals, the chemical action is generally considered to take one of two forms. In the first mechanism, the chemicals in the solution react with the metal layer to continuously form an oxide layer on the surface of the metal. This generally requires the addition of an oxidizer to the solution, such as hydrogen peroxide, ferric nitrate, etc. Then the mechanical abrasive action of the particles continuously and simultaneously removes this oxide layer. A judicious balance of these two processes obtains optimum results in terms of removal rate and polished surface quality.

In the second mechanism, no protective oxide layer is formed. Instead, the constituents in the solution chemically attack and dissolve the metal, while the mechanical action is largely one of mechanically enhancing the dissolution rate by such processes as continuously exposing more surface area to chemical attack, raising the local temperature (which increases the dissolution rate) by the friction between the particles and the metal and enhancing the diffusion of reactants and products to and away from the surface by mixing and by reducing the thickness of the boundary layer.

The slurry composition is an important factor in the CMP step. Depending on the choice of the oxidizing agent, the abrasive, and other useful additives, the polishing slurry can be tailored to provide effective polishing of metal layers at desired polishing rates while minimizing surface imperfections, defects, corrosion, and erosion of oxide in areas with tungsten vias. Furthermore, the polishing slurry may be used to provide controlled polishing selectivity to other thin-film materials used in current integrated circuit technology such as titanium, titanium nitride and the like.

There is a significant need for metal CMP process(es) and slurry(s) that afford low dishing and reduced plug recess effects, especially in view of the fact that the semiconductor industry continues to move towards smaller and smaller feature sizes. The present invention provides a solution to this significant need.

BRIEF SUMMARY OF THE INVENTION

In an embodiment, the invention is a method for chemical mechanical planarization of a surface having at least one feature thereon comprising a metal, said method comprising the steps of:
A) placing a substrate having the surface having the at least one feature thereon comprising the metal in contact with a polishing pad;
B) delivering a polishing composition comprising:
  a) an abrasive;
  b) a silatrane compound comprising a polycyclic compound and having at least one silicon atom present in a first bridgehead position and having at least one nitrogen atom present in a second bridgehead position; and
  c) an oxidizing agent; and
C) polishing the substrate with the polishing composition.

In another embodiment, the invention is a polishing composition comprising:
  a) an abrasive;
  b) a silatrane compound comprising a polycyclic compound and having at least one silicon atom present in a first bridgehead position and having at least one nitrogen atom present in a second bridgehead position; and
  c) an oxidizing agent.

DETAILED DESCRIPTION OF THE INVENTION

This invention includes a slurry and an associated method for chemical mechanical planarization of, preferably, a tungsten-containing substrate. Minimization or prevention of dishing/erosion and plug recess of features on semiconductor substrates during CMP processing is becoming increasingly more important as the semiconductor industry trends to smaller and smaller feature sizes in the manufacture of integrated circuits.

In an embodiment, the invention is a polishing composition and associated method, the composition comprising:
  a) an abrasive; and
  b) a silatrane compound comprising a polycyclic compound and having at least one silicon atom present in a first bridgehead position and having at least one nitrogen atom present in a second bridgehead position.

The silatrane compound according to the invention can be any polycyclic compound that has at least one silicon atom present in a first bridgehead position and has at least one nitrogen atom present in a second bridgehead position. The first and second bridgehead positions are preferably common to all the cyclic structures comprising the polycyclic silatrane. Suitable silatranes include, but are not limited to, those having the following structures:

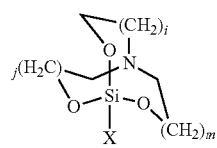

where i, j, and m are independently 1-4 and X is a substituent or group covalently bonded to the Si atom in the structure. A suitable X substituent or group includes, but is not limited to, those selected from the group consisting of $C_1$-$C_4$-alkyl, $C_1$-$C_4$-alkoxy, $C_1$-$C_4$-amino, $C_1$-$C_4$-amino-alcohol, $C_1$-$C_4$-carboxylic acid, and $C_1$-$C_6$-glycol.

A sub-type of the above type of silatrane is one having the following structure:

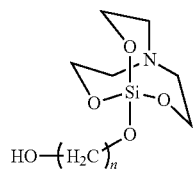

where i, j, and m are each equal to 2 and X is —O—$(CH_2)_n$—OH.

In one particular example of a silatrane having the immediately preceding structure, n is 2 and the structure is the following:

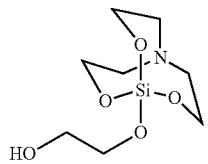

This particular silatrane is commercially available from Sigma Aldrich, Milwaukee, Wis.

In an embodiment, the silatrane has the following structure:

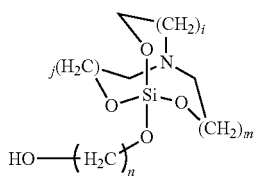

where i, j, and m are independently 1-4 and n is 1-6.

A suitable level for the silatrane component in the composition of this invention ranges from about 5 ppm to about 1 weight percent (10,000 ppm). In an embodiment, the level of silatrane ranges from about 50 ppm to about 2000 ppm, and, in another embodiment, the level ranges from about 100 ppm to about 1000 ppm. In yet another embodiment, the level of silatrane ranges from about 100 ppm to about 500 ppm.

Suitable oxidizing agents include, for example, one or more per-compounds, which comprise at least one perm group (—O—O—). Suitable per-compounds include, for example, peroxides (e.g., hydrogen peroxide and urea hydrogen peroxide), persulfates (e.g., monopersulfates and dipersulfates), percarbonates, perchlorates, perbromates, periodates, and acids thereof, and mixtures thereof, and the like, peroxyacids (e.g., peracetic acid, perbenzoic acid, m-chloroperbenzoic acid, salts thereof), mixtures thereof, and the like. Preferred oxidizing agents include hydrogen peroxide, urea-hydrogen peroxide, sodium or potassium peroxide, benzyl peroxide, di-t-butyl peroxide, peracetic acid, monopersulfuric acid, dipersulfuric acid, iodic acid, and salts thereof, and mixtures thereof. Hydrogen peroxide ($H_2O_2$) or periodic acid is a preferred oxidizing agent. Strong acid oxidizers, such as nitric acid, can also be used. The per-type oxidizer or strong acid oxidizer is typically present in an amount between about 0.1% and 10%, for example between 0.5% and 9%, and is advantageously between 1% and 5% by weight. When used, the preferred concentration of the $H_2O_2$ is from about 0.5% to about 7%, for example between 0.5% and about 4.5%.

Suitable abrasives for this invention include, but are not limited to, alumina, ceria, germania, silica, titania, zirconia, and mixtures thereof. In one embodiment, the abrasive is silica (colloidal silica or fumed silica). In an embodiment, the abrasive is colloidal silica. The abrasive level in the slurry can broadly range from about 0.1 weight percent to about 25 weight percent of the total weight of the slurry and, for example, can range from about 0.1 weight percent to about 15 weight percent. In an embodiment, the abrasive level ranges from about 2 weight percent to about 15 weight percent, and, in another embodiment, ranges from about 4 weight percent to about 14 weight percent, for example, from about 5 weight percent to about 13 weight percent. In a preferred embodiment, the abrasive level ranges from about 5 weight percent to about 13 weight percent.

Other chemicals that may be added to the CMP slurry composition include, for example, surfactants, pH-adjusting agents, acids, corrosion inhibitors, fluorine-containing compounds, chelating agents, nitrogen-containing compounds, and salts.

Suitable surfactant compounds that may be added to the slurry composition include, for example, any of the numerous nonionic, anionic, cationic or amphoteric surfactants known to those skilled in the art. The surfactant compounds may be present in the slurry composition in a concentration of about 0.0001 weight % to about 1 weight % and, when present, are preferably present in a concentration of about 0.001 weight % to about 0.1 weight % of the total weight of the slurry. The preferred types of surfactants are nonionic, anionic, or mixtures thereof and are most preferably present in a concentration of about 10 ppm to about 1000 ppm of the total weight of the slurry. A suitable nonionic surfactant is Surfynol® 104E, which is a 50:50 mixture by weight of 2,4,7,9-tetramethyl-5-decyn-4,7-diol and ethylene glycol (solvent), (Air Products and Chemicals, Allentown, Pa.). Suitable anionic surfactants include ammonium lauryl sulfate.

An (initial or additional) pH-adjusting agent may be used to improve the stability of the polishing composition, to improve the safety in handling and use, or to meet the requirements of various regulations. Suitable pH-adjusting agents or additional pH-adjusting agents to lower the pH of the polishing composition of the present invention include, but are not limited to, hydrochloric acid, nitric acid, sulfuric acid, chloroacetic acid, tartaric acid, succinic acid, citric acid, malic acid, malonic acid, various fatty acids, various polycarboxylic acids and mixtures thereof. Suitable pH-adjusting agents or additional pH-adjusting agents to raise the pH of the polishing composition of the present invention include, but are not limited to, potassium hydroxide, sodium hydroxide, ammonium hydroxide, tetramethylammonium hydroxide, ethylenediamine, piperazine, polyethyleneimine, modified polyethyleneimines, and mixtures thereof.

Suitable acid compounds that may be added to the slurry composition include, but are not limited to, formic acid, acetic acid, propanoic acid, butanoic acid, pentanoic acid, hexanoic acid, heptanoic acid, octanoic acid, nonanoic acid, lactic acid, hydrochloric acid, nitric acid, phosphoric acid, sulfuric acid, hydrofluoric acid, malic acid, tartaric acid, gluconic acid, citric acid, phthalic acid, pyrocatechoic acid, pyrogallol carboxylic acid, gallic acid, tannic acid, and mixtures thereof. These acid compounds may be present in the slurry composition in a concentration of about 0 weight % to about 1 weight % of the total weight of the slurry.

Suitable (initial or additional) chelating agents that may be added to the slurry composition include, but are not limited to, ethylenediaminetetracetic acid (EDTA), N-hydroxyethylethylenediaminetriacetic acid (NHEDTA), nitrilotriacetic acid (NTA), diethylenetriaminepentacetic acid (DPTA), ethanoldiglycinate, tricine, 2,2'-bipyridyl, tartaric acid, glutamic acid, aspartic acid, glutamine, L-aspartic acid, L-tryptophan, L-asparagine, L-arginine and mixtures thereof. The chelating agents may be present in the slurry composition in a concentration of about 0.001 weight % to about 3 weight %, and are preferably present in a concentration of about 0.05 weight % to about 0.20 weight % of the total weight of the slurry.

Suitable nitrogen-containing compounds that may be added to the slurry composition include, but are not limited to, ammonium hydroxide, hydroxylamine, monoethanolamine, diethanolamine, triethanolamine, diethyleneglycolamine, N-hydroxyethylpiperazine, polyethyleneimine, modified polyethyleneimines, and mixtures thereof. Suitable nitrogen-containing compounds also include various amino acids. Suitable amino acids include, but are not limited to, alanine, arginine, asparagine, aspartic acid, cysteine, glutamic acid, glutamine, glycine, histidine, isoleucine, leucine, lysine, methionine, phenylalanine, proline, serine, threonine, tryptophan, tyrosine, and valine. In an embodiment, the amino acid is glycine. The nitrogen-containing compounds may be present in the slurry composition in a concentration of about 0 weight % to about 1 weight %, and are preferably present in a concentration of about 0.01 weight % to about 0.20 weight % of the total weight of the slurry.

Suitable salts that may be added to the slurry composition include, but are not limited to, ammonium persulfate, potassium persulfate, potassium sulfite, potassium carbonate, ammonium nitrate, potassium hydrogen phthalate, hydroxylamine sulfate, and mixtures thereof. The salts may be present in the slurry composition in a concentration of about 0 weight % to about 10 weight %, and are preferably present in a concentration of about 0 weight % to about 5 weight % of the total weight of the slurry. A preferred salt is ammonium nitrate and is most preferably present in a concentration of about 0 weight % to about 0.15 weight % of the total weight of the slurry.

Still other chemicals that can be added to the slurry compositions are biological agents such as bactericides, biocides and fungicides especially if the pH is around about 6 to 9. Suitable biocides, include, but are not limited to, 1,2-benzisothiazolin-3-one; 2(hydroxymethyl)amino ethanol; 1,3-dihydroxymethyl-5,5-dimethylhydantoin; 1-hydroxymethyl-5,5-dimethylhydantion; 3-iodo-2-propynyl butylcarbamate; glutaraldehyde; 1,2-dibromo-2,4-dicyanobutane; 5-chloro-2-methyl-4-isothiazoline-3-one; 2-methyl-4-isothiazolin-3-one; and mixtures thereof.

The slurry compositions and associated methods of this invention can have pH values that broadly range from about 1 to about 11 and preferably range from about 1.5 to about 5, such as from about 2 to about 4. In an embodiment, the pH ranges from about 2 to about 4; in another embodiment, the pH ranges from about 5 to about 10. In many applications of this invention, such as for tungsten CMP, a pH value in the range from about 2 to about 4 is preferred. Having a pH below 2 can raise concerns about safety and corrosion incidents occurring at these low pH values. Having a pH above about 4 for tungsten CMP can result in significantly reduced tungsten removal rates.

Associated Method

The associated method of this invention entails use of the aforementioned composition (as disclosed supra) for chemical mechanical planarization of substrates comprised of metals and dielectric materials. In the method, a substrate (e.g., a wafer) is placed face-down toward a polishing pad which is fixedly attached to a rotatable platen of a CMP polisher. In this manner, the substrate to be polished and planarized is placed in direct contact with the polishing pad. A wafer carrier system or polishing head is used to hold the substrate in place and to apply a downward pressure against the backside of the substrate during CMP processing while the platen and the substrate are rotated. The polishing composition (slurry) is applied (usually continuously) on the pad during CMP processing to effect the removal of material to planarize the substrate.

In the composition and associated method of the invention, a removal rate of tungsten of at least 800 Angstroms per minute is maintained upon chemical-mechanical polishing thereof when polishing is done at 4 psi of down force. Higher removal rates are attained when down force values greater than 4 psi are used. In an embodiment, the removal rate of tungsten is at least 1000 Angstroms per minute at 4 psi of down force. In other embodiments, the removal rates of tungsten at 4 psi down force are at least 1200 Angstroms per minute, 1500 Angstroms per minute, and 2000 Angstroms per minute.

As indicated above, an embodiment of the invention is a composition for chemical mechanical polishing a metal-containing substrate (e.g., tungsten). In an embodiment, the surface of the substrate also has at least one feature thereon comprising a dielectric material. In an embodiment, the dielectric material is a silicon oxide.

While not being bound by any theory, the inventor offers the following explanation as to why certain silatranes, are particularly effective for metal polishing according to the invention. Silatranes, which are silane-containing cyclic organic amine compounds, can be described as two rings of organic inner ether type rings fused together using a silicon atom and a nitrogen atom as two bridging atoms. The lone pair of electrons from the nitrogen atom is considered to be able to donate the charges to the empty orbital of the silicon atom through a space effect. The existence of at least four coordination atoms located at different positions of this type of silane-containing cyclic organic amine compound makes such a compound suitable for passivating positively-charged tungsten cations through coordination interactions during a polishing process. Reduction of dishing on the polished metal (e.g., tungsten) substrate surface with inclusion of a silatrane as a component can be attributed to such coordination process-induced passivation protection, for example, as may occur on a tungsten via. If the X group is selected to contain more coordination atoms either with straight or branched chain structures, it will make such silane-containing cyclic organic amine compounds possess more sites that can be bounded to the oxidized tungsten cations during the polishing process.

Amino, amino-alcohol, organic carboxylic acid, and all other suitable groups can be easily attached to the silicon atom in a silatrane molecule. By attaching different functional groups onto the silicon atom, the solubility and surface passivation ability of the final prepared molecule can be tuned according to the application specifications. The final prepared and used molecule as a dishing reduction additive in a tungsten CMP slurry can be more hydrophilic or more hydrophobic on side chains which provide more selections to use them as suitable dishing reduction additives in a CMP slurry.

The present invention is further demonstrated by the examples below.

EXAMPLES

General

All percentages are weight percentages unless otherwise indicated.

CMP Methodology

In the examples presented below, CMP experiments were run using the procedures and experimental conditions given below.

GLOSSARY

Components

CDI4310: A chemical additive supplied by King Chemical Industries, Inc., Norwalk, Conn.
Fe-Coated Silica: Colloidal silica at 2.5 wt. % solids level having a particle size of approximately 45 nanometers; the silica particles are coated with iron to an extent such that iron atoms are bound to approximately 25% of the available binding sites on the silica particles.
Nyacol® 50: Colloidal silica particles supplied by Nyacol, Inc., Ashland, Mass. having an average particle size of approximately 50 nm.
TEOS: tetraethylorthosilicate
Polishing pad: Politex®, and IC1000 were used during CMP, supplied by DOW, Inc, (formerly supplied by Rodel (Rohm and Haas), which is now part of Dow, Inc.).
Parameters
General:
Å: angstrom(s)—an unit of length;
BP: back pressure, in psi units;
CMP: chemical mechanical planarization=chemical mechanical polishing;
CS: carrier speed;
DF: Down force: pressure applied during CMP, units psi;
min: minute(s);
ml: milliliter(s);
mV: millivolt(s);
psi: pounds per square inch;
PS: platen rotational speed of polishing tool, in rpm (revolution(s) per minute);
SF: slurry flow, ml/min;
wt. %: weight percentage (of a listed component);
W:TEOS Selectivity: removal rate of W/removal rate of TEOS.

Removal Rates
Tungsten Removal Rates: Measured tungsten removal rate at a given down pressure. The down pressure of the CMP tool was 4.0 psi in the examples below.

CMP Methodology
In the examples presented below, CMP experiments were run using the procedures and experimental conditions given below.

Metrology
Tungsten films were measured with a ResMap CDE, model 168, manufactured by Creative Design Engineering, Inc, 20565 Alves Dr., Cupertino, Calif., 95014. The ResMap tool is a four point probe sheet resistance tool. Forty nine point diameter scan at 5 mm edge exclusion for Tungsten film was taken.

CMP Tool:
The CMP tool that was used is a Mirra, manufactured by Applied Materials, 3050 Boweres Avenue, Santa Clara, Calif., 95054. A IC1000, kgroove stacked on a suba IV pad supplied by DOW, Inc, 451 Bellevue Rd., Newark, Del. 19713, (formerly supplied by Rodel) was used on platen 1 for blanket and pattern wafer studies. On Platen 3 a Politex pad, supplied by DOW, Inc. was used for the TEOS defect wafers after polishing on platen 1.

The IC1000 pad was broken-in by conditioning the pad for 18 mins. At 7 lbs down force on the conditioner. The Politex pad was broken-in by polishing twenty TEOS dummy wafers with deionized water. In order to qualify the tool settings and the pad break-in two tungsten monitors and two TEOS monitors were polished with Microplanar® CMP3850, supplied by DuPont Air Products NanoMaterials L.L.C. at baseline conditions.

Wafers:
Polishing experiments were conducted using CVD deposited Tungsten wafers. These blanket wafers were purchased from Silicon Valley Microelectronics, 2985 Kifer Rd., Santa Clara, Calif. 95051. The film thickness specifications are summarized below: W: 8,000 Å CVD tungsten, 240 Å TiN, 5000 Å TEOS on silicon.

Polishing Experiments:
In blanket wafer studies, tungsten blanket wafers were polished at baseline conditions. The tool baseline conditions were: table speed; 120 rpm, head speed: 123 rpm, membrane pressure; 3.0 psi, inter-tube pressure; 6.0 psi, retaining ring pressure; 6.5 psi, slurry flow; 120 ml/min.

The slurry was used in polishing experiments on patterned wafers (SKW5-3, supplied by SWK Associates, Inc. 2920 Scott Blvd. Santa Clara, Calif. 95054). These wafers were measured on the Veeco VX300 profiler/AFM instrument. The 100×100 micron line structure was used for dishing measurement, and 1×1 micron array was used for the erosion measurement. The wafer was measured at center, middle, and edge die positions.

Example 1

A point-of-use slurry was made up having the following composition:

| | |
|---|---|
| 1) Fe-coated Silica | 0.33 wt. % |
| 2) Colloidal Silica | 0.25 wt. % |
| 3) Silatrane (having structure 1) | 200 ppm |
| 4) Nyacol ® 50 | 0.50 wt. % |
| 5) Nitric Acid | ~0.02 wt. % to give pH = 2.5 |
| 6) Hydrogen Peroxide | 3.0 wt. % |
| 7) Deionized Water | Balance |

The slurry was utilized using the general methodology as described above to polish tungsten-containing wafers. With polishing conditions of 4.0 psi down force, 120 rpm, and 120 ml/min slurry flow rate, the tungsten wafers were planarized effectively and afforded a dishing level of 794 angstroms and a tungsten removal rate of 4242 angstroms/minute.

Example 2 (Comparative)

A point-of-use slurry was made up having the following composition:

| | |
|---|---|
| 1) Fe-coated Silica | 0.33 wt. % |
| 2) Colloidal Silica | 0.25 wt. % |
| 3) CDI4310 | 200 ppm |
| 4) Nyacol ® 50 | 0.50 wt. % |
| 5) Nitric Acid | ~0.02 wt. % to give pH = 2.5 |
| 6) Hydrogen Peroxide | 3.0 wt. % |
| 7) Deionized Water | Balance |

The slurry was utilized using the general methodology as described above to polish tungsten-containing wafers. With polishing conditions of 4.0 psi down force, 120 rpm, and 120 ml/min slurry flow rate, the tungsten wafers were planarized but a much higher dishing level of 1192 angstroms was measured (in comparison to that in Example 1) and the tungsten removal rate was 4187 angstroms/minute.

Example 3 (Comparative)

A point-of-use slurry was made up having the following composition:

| | |
|---|---|
| 1) Fe-coated Silica | 0.33 wt. % |
| 2) Colloidal Silica | 0.25 wt. % |
| 3) Nyacol ® 50 | 0.50 wt. % |
| 4) Nitric Acid | ~0.02 wt. % to give pH = 2.5 |
| 5) Hydrogen Peroxide | 3.0 wt. % |
| 6) Deionized Water | Balance |

The slurry was utilized using the general methodology as described above to polish tungsten-containing wafers. With polishing conditions of 4.0 psi down force, 120 rpm, and 120 ml/min slurry flow rate, the tungsten wafers were planarized but a much higher dishing level in excess of 2000 angstroms was measured and the tungsten removal rate was 4374 angstroms/minute.

The invention claimed is:

1. A method for chemical mechanical planarization of a surface having at least one feature thereon comprising a metal, said method comprising the steps of:
   A) placing a substrate having the surface having the at least one feature thereon comprising the metal in contact with a polishing pad;
   B) delivering a polishing composition comprising:
      a) an abrasive;
      b) a silatrane compound comprising a polycyclic compound and having at least one silicon atom present in a first bridgehead position and having at least one nitrogen atom present in a second bridgehead position; and
      c) an oxidizing agent; and
   C) polishing the substrate with the polishing composition.

2. The method of claim 1 wherein the silatrane compound has the structure:

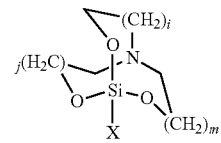

where i, j, and m are each independently 1-4 and X is a substituent or group covalently bonded to the Si atom in the structure.

3. The method of claim 2 wherein the silatrane compound has the structure:

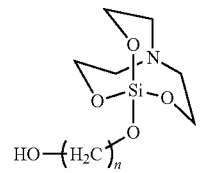

where n=1-6.

4. The method of claim 2 wherein X is selected from the group consisting of $C_1$-$C_4$-alkyl, $C_1$-$C_4$-alkoxy, $C_1$-$C_4$-amino, $C_1$-$C_4$-amino-alcohol, $C_1$-$C_4$-carboxylic acid, and $C_1$-$C_4$-glycol.

5. The method of claim 3 wherein the silatrane compound has the structure:

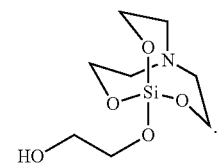

6. The method of claim 1 wherein the metal is selected from the group consisting of copper and tungsten.

7. The method of claim 6 wherein the metal is tungsten.

8. The method of claim 1 wherein the polishing composition has a pH from about 1 to about 5.

9. The method of claim 1 wherein the oxidizing agent is hydrogen peroxide.

* * * * *